US012787758B2

(12) United States Patent
Lo et al.

(10) Patent No.: US 12,787,758 B2
(45) Date of Patent: Nov. 3, 2026

(54) SEMICONDUCTOR DEVICE HAVING LOW DIELECTRIC CAPACITANCE, AND METHOD FOR MANUFACTURING THE SAME

(71) Applicant: TAIWAN SEMICONDUCTOR MANUFACTURING COMPANY, LTD., Hsinchu (TW)

(72) Inventors: Ting-Ya Lo, Hsinchu (TW); Gary Liu, Hsinchu (TW); Chi-Lin Teng, Hsinchu (TW); Zi-Yi Yang, Hsinchu (TW); Chuan-Pu Chou, Hsinchu (TW); Hsin-Yen Huang, Hsinchu (TW); Chia-Tien Wu, Hsinchu (TW); Hsiao-Kang Chang, Hsinchu (TW); Shao-Kuan Lee, Hsinchu (TW); Chia-Chen Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 377 days.

(21) Appl. No.: 18/512,624

(22) Filed: Nov. 17, 2023

(65) Prior Publication Data

US 2025/0167042 A1 May 22, 2025

(51) Int. Cl.
*H10W 20/46* (2026.01)
*H10W 20/00* (2026.01)
(Continued)

(52) U.S. Cl.
CPC ......... *H10W 20/46* (2026.01); *H10W 20/033* (2026.01); *H10W 20/056* (2026.01);
(Continued)

(58) Field of Classification Search
CPC ... H10W 20/46; H10W 20/43; H10W 20/033; H10W 20/072; H10W 20/076; H10W 10/056; H10W 20/0765
(Continued)

(56) References Cited

U.S. PATENT DOCUMENTS

2003/0211724 A1* 11/2003 Haase .................... B82Y 10/00 257/E21.171
2020/0118870 A1* 4/2020 van der Straten ........................... H01L 21/76844
(Continued)

*Primary Examiner* — Phuc T Dang
(74) *Attorney, Agent, or Firm* — Birch, Stewart, Kolasch & Birch, LLP

(57) ABSTRACT

A method for manufacturing a semiconductor device includes: forming a conductive structure; forming an interconnect layer on the conductive structure, the interconnect layer including a conductive interconnect that is electrically connected to the conductive structure; and forming multiple conductive features and multiple spacer features on the interconnect layer, adjacent two of the conductive features being spaced apart from each other by a corresponding one of the spacer features, one of the conductive features being electrically connected to the conductive interconnect, each of the spacer features including a dielectric spacer layer contacting lateral surfaces of two of the conductive features that are adjacent to the spacer feature, and a cover segment disposed on the dielectric spacer layer and cooperating with the dielectric spacer layer to define an air gap between the two of the conductive features that are adjacent to the spacer feature.

20 Claims, 14 Drawing Sheets

(51) Int. Cl.
*H10W 20/43* (2026.01)
*H10W 20/48* (2026.01)

(52) U.S. Cl.
CPC ....... *H10W 20/072* (2026.01); *H10W 20/076* (2026.01); *H10W 20/43* (2026.01); *H10W 20/48* (2026.01); *H10W 20/0765* (2026.01)

(58) Field of Classification Search
USPC .......................................................... 257/758
See application file for complete search history.

(56) References Cited

U.S. PATENT DOCUMENTS

| | | | | |
|---|---|---|---|---|
| 2020/0152746 | A1* | 5/2020 | Tsau | H10D 30/6735 |
| 2020/0373304 | A1* | 11/2020 | Borsari | H10B 12/30 |
| 2021/0375751 | A1* | 12/2021 | Dai | H01L 21/76885 |
| 2023/0068760 | A1* | 3/2023 | Huang | H01L 21/7682 |

* cited by examiner

SEMICONDUCTOR DEVICE HAVING LOW DIELECTRIC CAPACITANCE, AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, making a semiconductor device with low dielectric capacitance becomes particularly challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
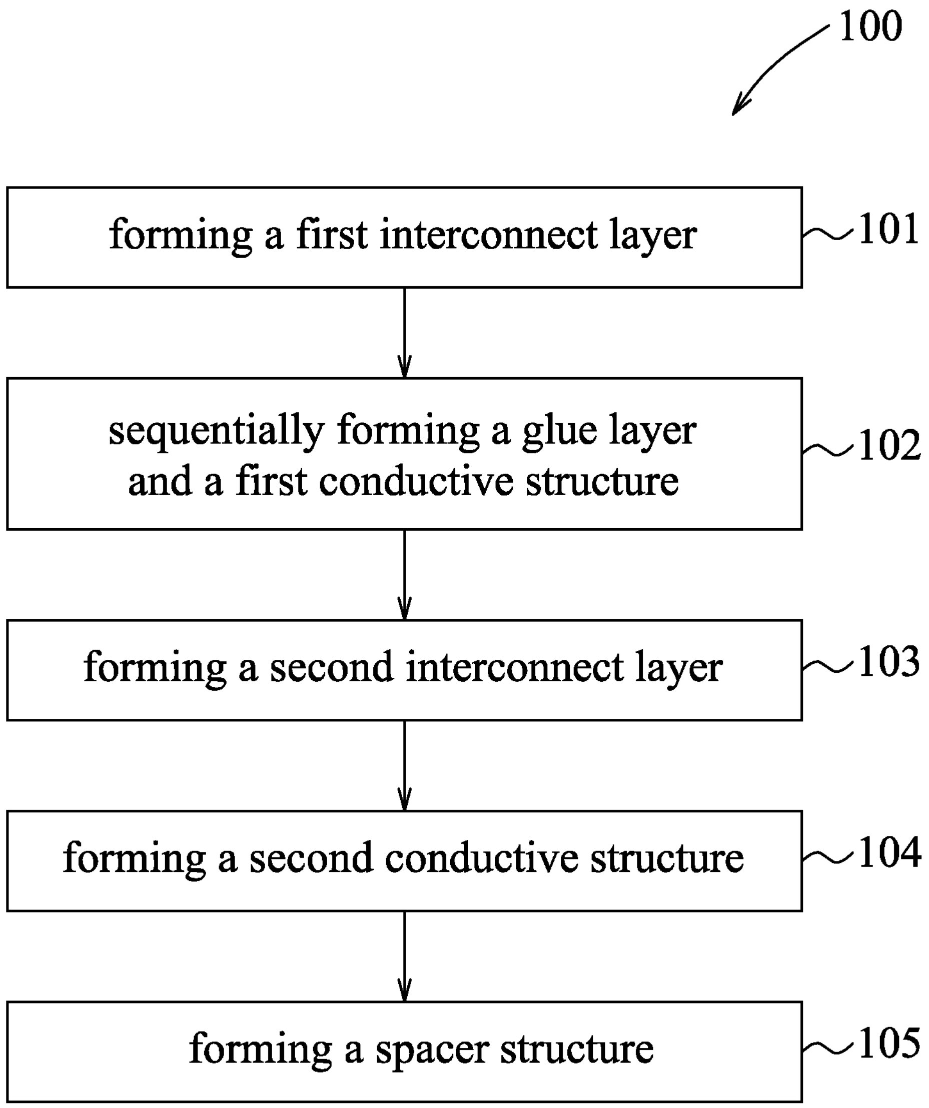
FIG. 1 is a flow chart illustrating a method for manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

FIG. 1 is a flow chart illustrating a method 100 for manufacturing a semiconductor device in accordance with some embodiments. FIGS. 2 to 12 are schematic sectional views of semiconductor structures 600 during various stages of the method 100. The method 100 and the semiconductor structures 600 will be described together below. It should be noted that additional steps can be provided before, after or during the method 100, and some of the steps described herein may be replaced by other steps or be eliminated. Similarly, further additional features may be present in the semiconductor structures 600, and/or features present may be replaced or eliminated in additional embodiments.

Figure 2:
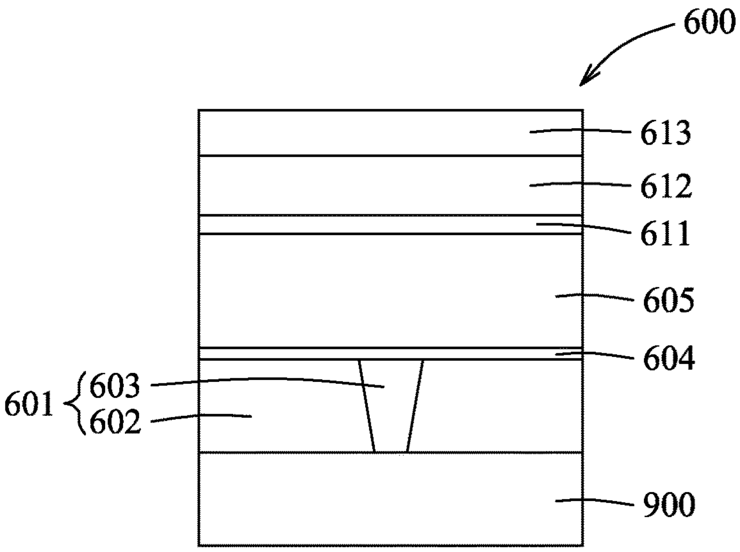
FIGS. 2 to 12 are schematic sectional views illustrating intermediate stages of the method for manufacturing a semiconductor device in accordance with some embodiments.

Referring to FIGS. 1 and 2, the method 100 begins at step 101, where a first interconnect layer 601 is formed on a substrate 900. The first interconnect layer 601 includes a dielectric layer 602 provided with a through hole, and a conductive interconnect 603 (e.g., a conductive contact) that is filled in the through hole.

In some embodiments, the dielectric layer 602 may be formed on the substrate 900 by a suitable deposition process known to those skilled in the art of semiconductor fabrication, such as atomic layer deposition (ALD), chemical vapor deposition (CVD), physical vapor deposition (PVD), other suitable techniques, or combinations thereof; and a conductive material may be filled into the through hole and then subjected to a planarization treatment (e.g., chemical mechanical planarization (CMP)) to form the conductive interconnect 603 in the through hole. In some embodiments, the conductive material for forming the conductive interconnect 603 may be provided as multiple layers having varying compositions, and may be filled into the through hole by a suitable deposition process known in the art of semiconductor fabrication, such as electroless plating, electroplating, sputter deposition, physical vapor deposition (PVD), chemical vapor deposition (CVD), atomic layer deposition (ALD), other suitable techniques, or combinations thereof. In some embodiments, the dielectric layer 602 may be made of a dielectric material, such as silicon oxide, SiOC-based materials (e.g., SiOCH), borophosphosilicate glass (BPSG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. In some embodiments, silicon oxide may be formed from tetraethyl orthosilicate (TEOS). In some embodiments, the conductive material for forming the conductive interconnect 603 may be, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. In some embodiments, the conductive interconnect 603 may have a thickness that falls within a range of from about 50 Å to about 500 Å.

In some embodiments, the substrate 900 may be a semiconductor substrate, e.g., an elemental semiconductor compound semiconductor. An elemental semiconductor is composed of a single species of atoms, such as silicon (Si) or germanium (Ge) in column IV of the periodic table. A compound semiconductor is composed of two or more elements, such as silicon carbide, gallium arsenide, gallium phosphide, indium phosphide, indium arsenide, indium antimonide, silicon germanium, gallium arsenide phosphide, aluminum indium arsenide, aluminum gallium arsenide, gallium indium arsenide, gallium indium phosphide, gallium indium arsenide phosphide, or the like. The compound semiconductor may have a gradient feature in which the composition thereof changes from one ratio at one location to another ratio at another location in the compound semiconductor. The compound semiconductor may be formed over a silicon substrate, and the compound semiconductor may be strained. In some embodiments, the substrate 900 may include a multilayer compound semiconductor device. Alternatively, the substrate 900 may include a non-semiconductor material, such as glass, fused quartz, or calcium fluoride. Furthermore, in some embodiments, the substrate 900 may be a silicon on insulator (SOI) substrate (e.g., silicon germanium on insulator (SGOI)). Generally, an SOI substrate includes a layer of a semiconductor material such as epitaxial silicon, germanium, silicon germanium, or combinations thereof. The substrate may be doped with a p-type dopant, such as boron (Br), aluminum, gallium (Ga), or the like, or may alternatively be doped with an n-type dopant, as is known in the art. In some embodiments, the substrate 900 may include a doped epitaxial layer. Shallow trench isolation (STI) regions (not shown) may be formed in the substrate 900 to isolate active regions (not shown), such as source or drain regions of an integrated circuit device (not shown) in the substrate 900. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnects, or the like, based on practical applications. In addition, through-vias (not shown) may be formed to extend into the substrate 900 for electrically connecting features on opposite sides of the substrate 900.

Referring to FIGS. 1 and 2, the method 100 then proceeds to step 102, where a glue layer 604 and a first conductive structure 605 are sequentially formed on the first interconnect layer 601. The first conductive structure 605 is electrically connected to the conductive interconnect 603 through the glue layer 604. The glue layer 604 can provide good adhesion to the dielectric layer 602, the conductive interconnect 603 and the first conductive structure 605. In some embodiments, the glue layer 604 may be formed on the first interconnect layer 601 by a suitable deposition process known in the art of semiconductor fabrication, such as physical vapor deposition (PVD), chemical vapor deposition (CVD), atomic layer deposition (ALD), other suitable techniques, or combinations thereof. In some embodiments, the glue layer 604 may be made of a nitride of tantalum (Ta), titanium (Ti), or other suitable metals. In some embodiments, the glue layer 604 may have a thickness that falls within a range of from about 2 Å to about 100 Å. In some embodiments, the first conductive structure 605 may be a conductive layer, may be formed on the glue layer 604 by a suitable deposition process known in the art of semiconductor fabrication, such as physical vapor deposition (PVD), chemical vapor deposition (CVD), atomic layer deposition (ALD), other suitable techniques, or combinations thereof. In some embodiments, the first conductive structure 605 may be made of a conductive material, such as copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. In some embodiments, the first conductive structure 605 may have a thickness that falls within a range of from about 50 Å to about 500 Å.

Figure 3:
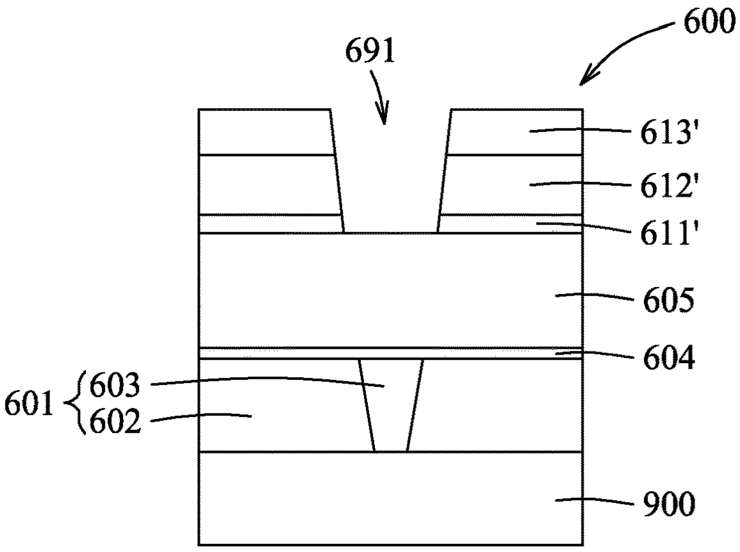
Figure 4:
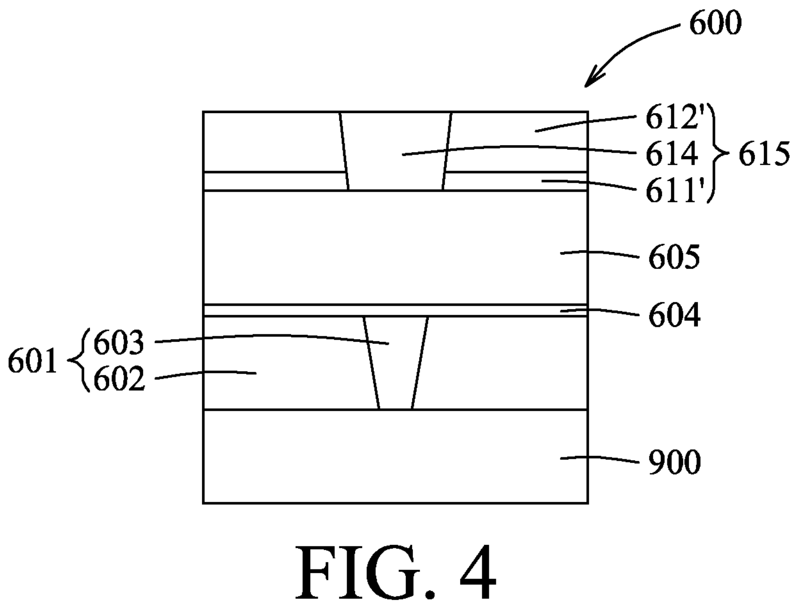

Referring to FIGS. 1, 2, 3 and 4, the method 100 then proceeds to step 103, where a second interconnect layer 615 is formed on the first conductive structure 605. As shown in FIG. 4, the second interconnect layer 615 includes a patterned etch stop layer 611', a patterned dielectric layer 612' and a conductive interconnect 614. The patterned etch stop layer 611' is disposed on the first conductive structure 605. The patterned dielectric layer 612' is disposed on the patterned etch stop layer 611'. The patterned etch stop layer 611' and the patterned dielectric layer 612' cooperatively define a through hole 691 shown in FIG. 3. The conductive interconnect 614 (e.g., a conductive via) is filled in the through hole 691, and is electrically connected to the first conductive structure 605. In some embodiments, step 103 may be implemented as described below.

First, as shown in FIG. 2, an etch stop layer 611, a dielectric layer 612 and a mask layer 613 (e.g., a hard mask layer) are sequentially formed on the first conductive structure 605. In some embodiments, the etch stop layer 611 may be formed on the first conductive structure 605 by a suitable deposition process known to those skilled in the art of semiconductor fabrication, such as physical vapor deposition (PVD), chemical vapor deposition (CVD), atomic layer deposition (ALD), other suitable techniques, or combinations thereof. In some embodiments, the etch stop layer 611 may be made of aluminum compounds (e.g., aluminum nitride, aluminum oxynitride, aluminum oxide, etc.), silicon compounds (e.g., silicon oxycarbide, silicon carbonitride, silicon nitride, silicon oxycarbonitride, etc.), other suitable materials, or combinations thereof. In some embodiments, the dielectric layer 612 may be formed on the etch stop layer 611 by a suitable deposition process known to those skilled in the art of semiconductor fabrication, such as physical vapor deposition (PVD), chemical vapor deposition (CVD), atomic layer deposition (ALD), plasma-enhanced chemical vapor deposition (PECVD), plasma-enhanced atomic layer deposition (PEALD), other suitable techniques, or combinations thereof. In some embodiments, the dielectric layer 612 may be made of a low-k dielectric material, such as silicon oxide, silicon nitride, silicon carbide, silicon oxycarbide, silicon oxynitride, silicon carbonitride, silicon oxycarbonitride, other suitable materials, or combinations thereof. In some embodiments, the mask layer 613 may be formed on the dielectric layer 612 by a suitable deposition process known to those skilled in the art of semiconductor fabrication, such as physical vapor deposition (PVD), chemical vapor deposition (CVD), atomic layer deposition (ALD), other suitable techniques, or combinations thereof. In some embodiments, the mask layer 613 may be made of, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, other suitable materials, or combinations thereof.

Next, as shown in FIG. 3, the mask layer 613, the dielectric layer 612 and the etch stop layer 611 are patterned to form a patterned mask layer 613', the patterned dielectric layer 612' and the patterned etch stop layer 611'. The patterned dielectric layer 612' and the patterned etch stop layer 611' cooperatively define the through hole 691. In some embodiments, the mask layer 613 may be patterned using photolithography and photoresist developing technology as is known to those skilled in the art of semiconductor fabrication. For example, the mask layer 613 may be patterned by 193 nm immersion lithography or EUV lithography. A pattern formed in the patterned mask layer 613' is then transferred to the dielectric layer 612 and the etch stop layer 611 by one or more etching processes to form the patterned dielectric layer 612' and the patterned etch stop layer 611'.

Then, as shown in FIGS. 3 and 4, the conductive interconnect 614 is formed in the through hole 691 by: (a) depositing a conductive material for forming the conductive interconnect 614 on the semiconductor structure 600 depicted in FIG. 3 to fill the through hole 691 using, for example, physical vapor deposition (PVD), chemical vapor deposition (CVD), atomic layer deposition (ALD), other suitable techniques, or combinations thereof; and (b) removing an excess of the conductive material and the patterned mask layer 613' using, for example, chemical mechanical polishing (CMP), or other suitable planarization techniques, so as to expose a top surface of the patterned dielectric layer 612'. A portion of the conductive material that remains in the through hole 691 serves as the conductive interconnect 614. In some embodiments, the conductive material may include, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. In some embodiments, the conductive interconnect 614 may have a thickness that falls within a range of from about 50 Å to about 500 Å.

Figure 5:
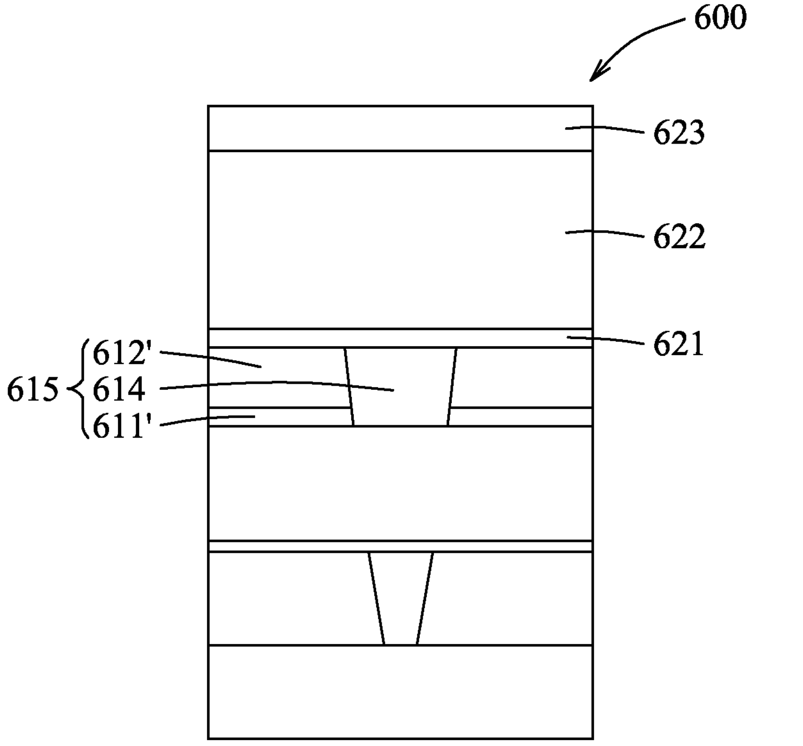
Figure 6:
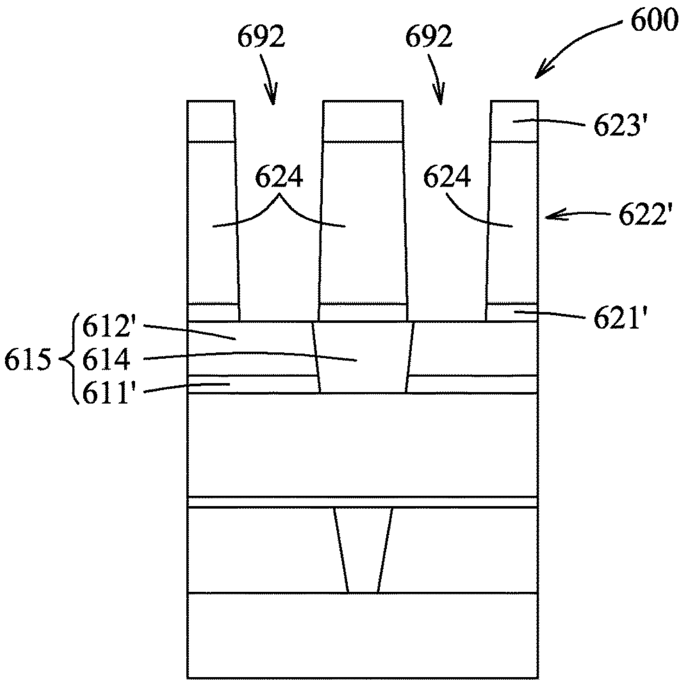

Referring to FIGS. 1, 5 and 6, the method 100 then proceeds to step 104, where a second conductive structure 622' is formed on the second interconnect layer 615. As shown in FIG. 6, the second conductive structure 622' includes a plurality of conductive features 624 (e.g., conductive metal lines). Adjacent two of the conductive features 624 are spaced apart from each other by a corresponding one of a plurality of recesses 692. One of the conductive features 624 is electrically connected to the conductive interconnect 614. In some embodiments, step 104 may be implemented as described below.

First, as shown in FIG. 5, a glue layer 621, a conductive layer 622 for forming the second conductive structure 622', and a mask layer 623 (e.g., a hard mask layer) are sequentially formed on the second interconnect layer 615. The glue layer 621 can provide good adhesion to the patterned dielectric layer 612', the conductive interconnect 614 and the conductive layer 622. In some embodiments, the glue layer 621 may be formed on the second interconnect layer 615 by a suitable deposition process known in the art of semiconductor fabrication, such as physical vapor deposition (PVD), chemical vapor deposition (CVD), atomic layer deposition (ALD), other suitable techniques, or combinations thereof. In some embodiments, the glue layer 621 may be made of a nitride of tantalum (Ta), titanium (Ti), or other suitable metals. In some embodiments, the glue layer 621 may have a thickness that falls within a range of from about 2 Å to about 100 Å. In some embodiments, the conductive layer 622 may be formed on the glue layer 621 by a suitable deposition process known in the art of semiconductor fabrication, such as physical vapor deposition (PVD), chemical vapor deposition (CVD), atomic layer deposition (ALD), other suitable techniques, or combinations thereof. In some embodiments, the conductive layer 622 may be made of a conductive material, such as copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. In some embodiments, the conductive layer 622 may have a thickness that falls within a range of from about 50 Å to about 500 Å. In some embodiments, the mask layer 623 may be formed on the conductive layer 622 by a suitable deposition process known in the art of semiconductor fabrication, such as physical vapor deposition (PVD), chemical vapor deposition (CVD), atomic layer deposition (ALD), other suitable techniques, or combinations thereof. In some embodiments, the mask layer 623 may be made of, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, other suitable materials, or combinations thereof.

Then, as shown in FIGS. 5 and 6, the mask layer 623 is patterned using photolithography and photoresist developing technology as is known to those skilled in the art of semiconductor fabrication. For example, the mask layer 623 may be patterned by 193 nm immersion lithography or extreme ultraviolet (EUV) lithography. A pattern formed in the patterned mask layer 623' is then transferred to the conductive layer 622 and the glue layer 621 by one or more etching processes to form the second conductive structure 622' and the patterned glue layer 621'. The etching process for forming the second conductive structure 622' may be implemented by, for example, reactive ion etching (RIE), plasma etching, deep RIE, atomic layer etching, etc., using an etching gas, such as $CHF_3$, $CH_2F_2$, $CF_4$, $C_4F_8$, $C_4F_6$, $N_2$, Ar, $O_2$, $NF_3$, $CO_2$, $H_2$, etc.

Figure 10:
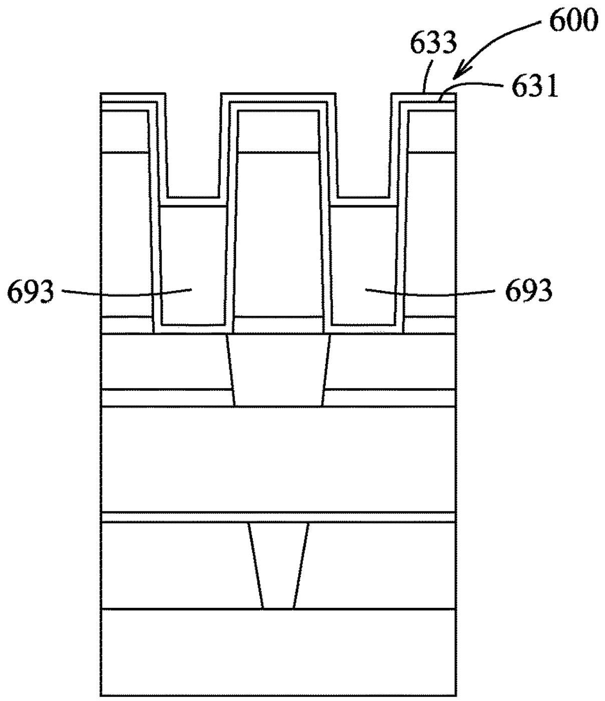
Figure 11:
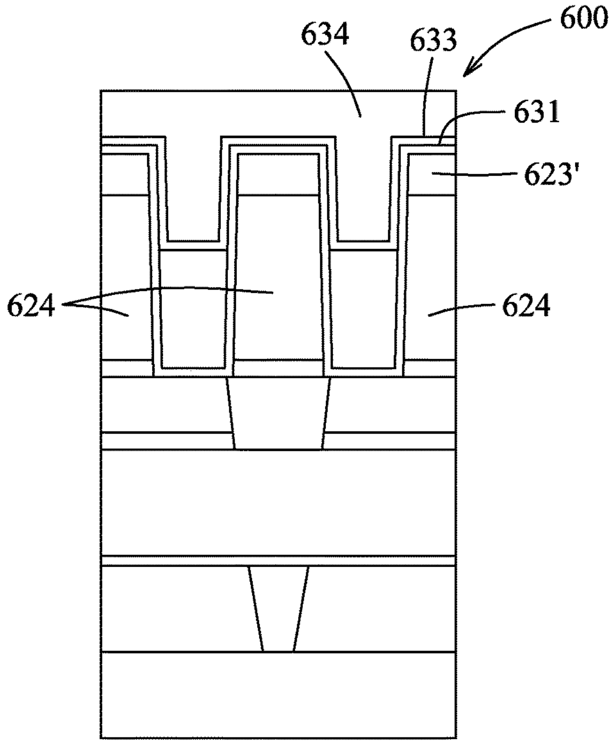
Figure 12:
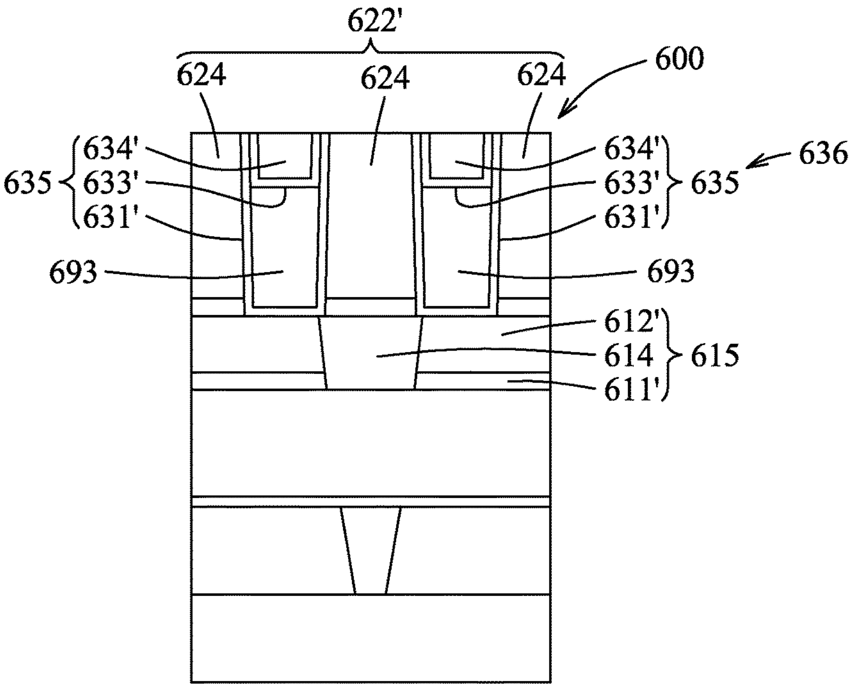

Referring to FIGS. 1 and 7-12, the method 100 then proceeds to step 105, where a spacer structure 636 is formed on the second interconnect layer 615. As shown in FIG. 12, the spacer structure 636 includes a plurality of spacer features 635 that are respectively disposed in the recesses 692 shown in FIG. 6. Each of the spacer features 635 includes a dielectric spacer layer 631', a sustaining cap 633' and a dielectric spacer element 634', where the sustaining cap 633' and the dielectric spacer element 634' cooperatively constitute a cover segment. With respect to each of the spacer features 635, the dielectric spacer layer 631' is formed into a caved shape, and contacts lateral surfaces of two of the conductive features 624 that cooperatively define the respective one of the recesses 692; the sustaining cap 633' is formed on the dielectric spacer layer 631', and cooperates with the dielectric spacer layer 631' to define an air gap 693 between said two of the conductive features 624 that cooperatively define the respective one of the recesses 692; and the dielectric spacer element 634' is formed on the sustaining cap 633', and sidewalls and bottom of the dielectric spacer element 634' are conformally covered by the sustaining cap 633'. In some embodiments, step 105 may be implemented as described below.

Figure 7:
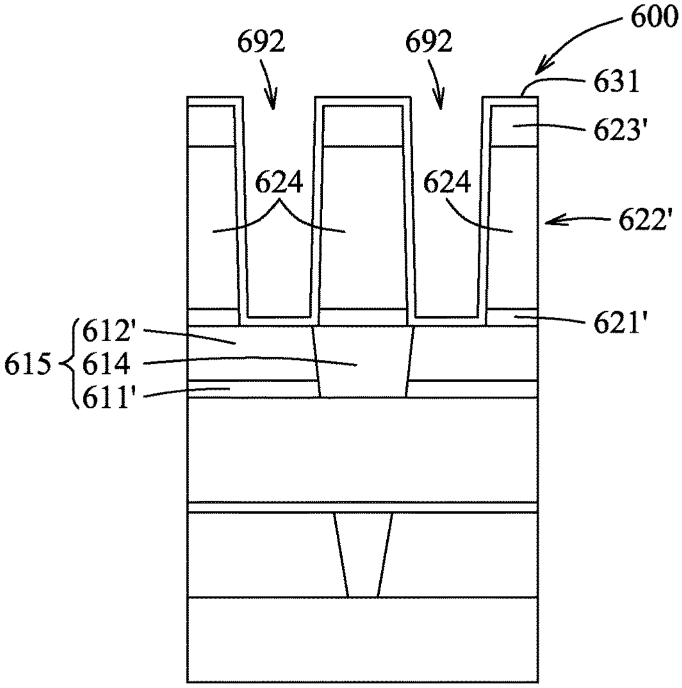

First, as shown in FIG. 7, a dielectric capping layer 631 for forming the dielectric spacer layers 631' of the spacer features 635 shown in FIG. 12 is conformally formed on the semiconductor structure 600 depicted in FIG. 6. The dielectric capping layer 631 can provide good adhesion to the patterned dielectric layer 612', the conductive interconnect 614, the patterned glue layer 621' and the conductive features 624. In some embodiments, the dielectric capping layer 631 may be formed by a suitable deposition process known to those skilled in the art of semiconductor fabrication, such as physical vapor deposition (PVD), chemical vapor deposition (CVD), atomic layer deposition (ALD), plasma-enhanced chemical vapor deposition (PECVD), plasma-enhanced atomic layer deposition (PEALD), other suitable techniques, or combinations thereof. In some embodiments, the dielectric capping layer 631 may be made of, for example, silicon oxide, silicon oxycarbide, silicon oxynitride, silicon carbonitride, silicon oxycarbonitride, aluminum nitride, aluminum oxynitride, aluminum oxide, other suitable materials, or combinations thereof. In some embodiments, the dielectric capping layer 631 may have a thickness that falls within a range of from about 2 Å to about 50 Å.

Figure 8:
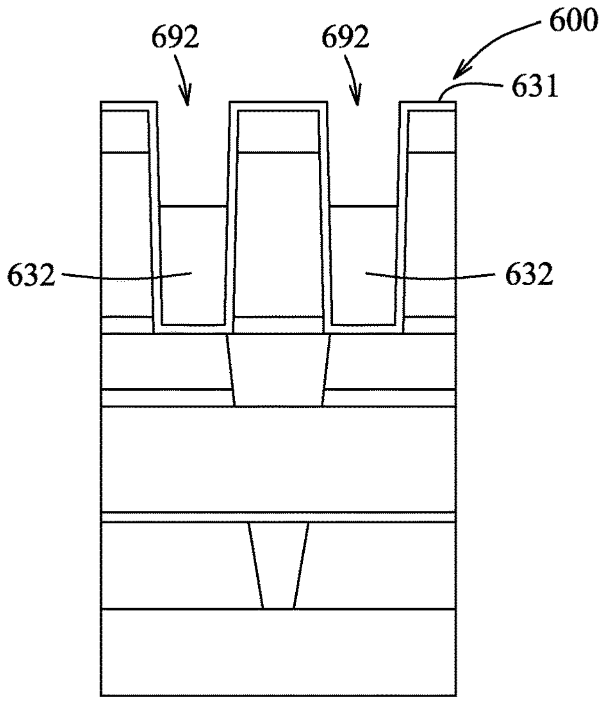

Next, as shown in FIG. 8, a sacrificial layer is formed on the semiconductor structure 600 depicted in FIG. 7 to fill the recesses 692, and the sacrificial layer is then recessed to form the sacrificial features 632 in the recesses 692. In some embodiments, the sacrificial layer may be formed by a suitable deposition process known to those skilled in the art of semiconductor fabrication, such as chemical vapor deposition (CVD), atomic layer deposition (ALD), molecular layer deposition (MLD), spin-on deposition, other suitable techniques, or combinations thereof. In some embodiments, the sacrificial layer may include a sacrificial polymer; examples of the sacrificial polymer include polylactic acid, polycaprolactone, polyurea, poly(methyl methacrylate), poly(ethylene oxide), other suitable materials, and combinations thereof. In some embodiments, recessing the sacrificial layer may be conducted by a thermal recess treatment, an etching back treatment, other suitable techniques, or combinations thereof. In some embodiments, the thermal recess treatment may be implemented at an annealing temperature ranging from 200° C. to 400° C. for an annealing time period ranging from 5 minutes to 40 minutes. In some embodiments, the etching back treatment may be implemented by a suitable anisotropic etching (for example, anisotropic dry etching, but not limited thereto) at room temperature for a time period ranging from 10 seconds to 300 seconds. In some embodiments, the heights of the sacrificial features 632 may be controlled by adjusting the operation parameters for the thermal recess treatment or the etching back treatment. In some embodiments, the heights of the sacrificial features 632 may fall within a range of from about 10 Å to about 100 Å.

Figure 9:
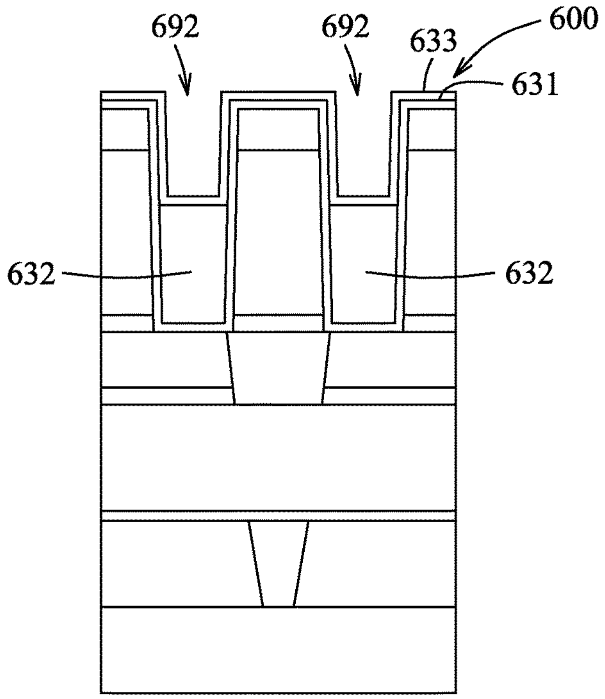

Then, as shown in FIG. 9, a sustaining layer 633 for forming the sustaining caps 633' of the spacer features 635 shown in FIG. 12 is conformally formed on the semiconductor structure 600 depicted in FIG. 8. In some embodiments, the sustaining layer 633 may be formed by a suitable deposition process known to those skilled in the art of semiconductor fabrication, such as physical vapor deposition (PVD), chemical vapor deposition (CVD), atomic layer deposition (ALD), plasma-enhanced chemical vapor deposition (PECVD), plasma-enhanced atomic layer deposition (PEALD), other suitable techniques, or combinations thereof. In some embodiments, the sustaining layer 633 may be made of, for example, silicon oxide, silicon oxycarbide, silicon oxynitride, silicon carbonitride, silicon oxycarbonitride, other suitable materials, or combinations thereof. In some embodiments, the sustaining layer 633 may have a thickness that falls within a range of from about 2 Å to about 100 Å.

Subsequently, as shown in FIGS. 9 and 10, the sacrificial features 632 are removed so as to form a plurality of air gaps 693 that are covered by the sustaining layer 633. The sustaining layer 633 can provide good mechanical strength to keep robustness of the air gaps 693. In some embodiments, the sacrificial features 632 may be removed by thermal treatment, ultraviolet treatment, other suitable techniques, or combinations thereof. In some embodiments, the sacrificial features 632 may be removed by a thermal treatment at a temperature ranging from 300° C. to 400° C. for a time period ranging from 10 seconds to 10 minutes to permit the sacrificial features 632 to vaporize and to degas through the sustaining layer 633. When the thermal treatment is implemented at a temperature lower than 300° C., the sacrificial features 632 may be removed insufficiently. On the other hand, when the thermal treatment is implemented at a temperature higher than 400° C., other materials involved in a back end of line (BEOL) process may be adversely affected. In addition, when the thermal treatment is implemented for a time period less than 10 seconds, the residual of the sacrificial features 632 may remain in the recesses 692, causing a particle issue. On the other hand, when the thermal treatment is implemented for a time period greater than 10 minutes, the thermal treatment would not be cost effective. In some embodiments, the sacrificial features 632 may be removed by an ultraviolet treatment at an ultraviolet exposure energy density ranging from 10 $mJ/cm^2$ to 100 $mJ/cm^2$ for a time period ranging from 10 seconds to 10 minutes. When the ultraviolet treatment is implemented at an ultraviolet exposure energy density lower than 10 $mJ/cm^2$, the residual of the sacrificial features 632 may remain in the recesses 692, causing a particle issue. On the other hand, when the ultraviolet treatment is implemented at an ultraviolet exposure energy density higher than 100 $mJ/cm^2$, other materials around the sacrificial features 632 may be damaged. In addition, when the ultraviolet treatment is implemented for a time period less than 10 seconds, the residual of the sacrificial features 632 may remain in the recesses 692, causing a particle issue. On the other hand, when the ultraviolet treatment is implemented for a time period greater than 10 minutes, the ultraviolet treatment would not be cost effective.

Afterwards, as shown in FIG. 11, a dielectric cover layer 634 for forming the dielectric spacer elements 634' of the spacer features 635 shown in FIG. 12 is formed on the sustaining layer 633. The dielectric cover layer 634 can provide good adhesion to the sustaining layer 633. In some embodiments, the dielectric cover layer 634 may be formed by a suitable deposition process known to those skilled in the art of semiconductor fabrication, such as chemical vapor deposition (CVD), atomic layer deposition (ALD), spin-on deposition, other suitable techniques, or combinations thereof. In some embodiments, the dielectric cover layer 634 may be made of a low-k dielectric material such as SiCOH, which is a dielectric material containing silicon (Si), carbon (C), oxygen (O), and hydrogen (H) atoms.

Lastly, as shown in FIGS. 11 and 12, the semiconductor structure 600 depicted in FIG. 11 is subjected to a planarization treatment (e.g., chemical mechanical polishing (CMP)) to expose top surfaces of the conductive features 624, and to form the spacer features 635. An excess of the dielectric cover layer 634 is removed so as to form the dielectric spacer elements 634' of the spacer features 635. An excess of the sustaining layer 633 is removed so as to form the sustaining caps 633' of the spacer features 635. An excess of the dielectric capping layer 631 is removed so as to form the dielectric spacer layers 631' of the spacer features 635.

In some embodiments, by virtue of forming the second conductive structure 622' before the spacer structure 636 is formed, metal damage and dielectric damage can be prevented. In addition, in some embodiments, a barrier layer or a glue layer with large resistance need not be formed between the second conductive structure 622' and the spacer structure 636, so the semiconductor structure 600 can have low metal resistivity.

In some embodiments, by virtue of the air gaps 693, the semiconductor structure 600 can have low dielectric capacitance.

Figure 13:
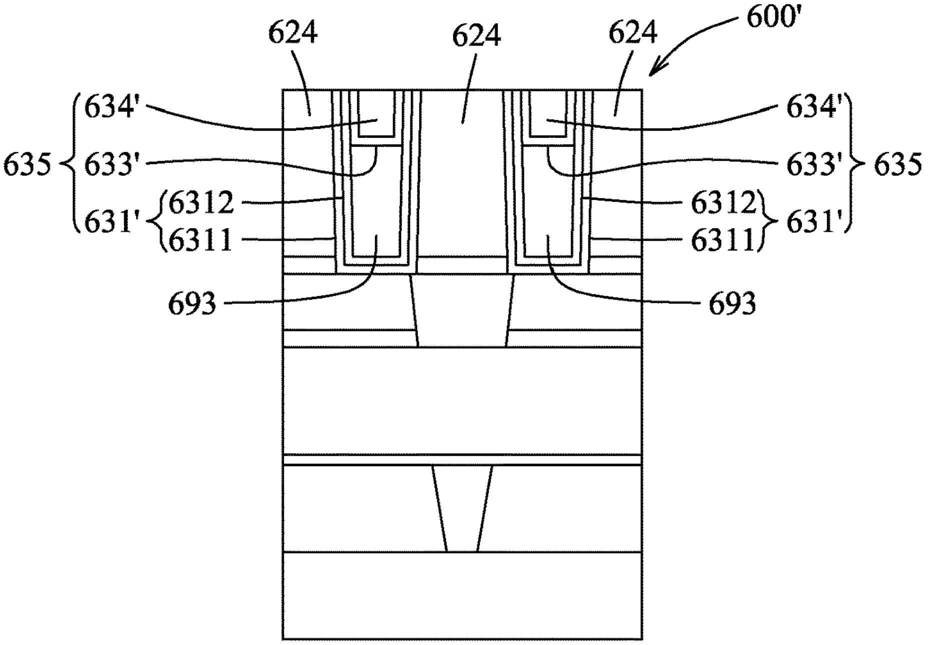
FIG. 13 is a schematic sectional view illustrating a semiconductor device in accordance with some embodiments.

FIG. 13 is a schematic sectional view illustrating a semiconductor structure 600' in accordance with some embodiments. The semiconductor structure 600' depicted in FIG. 13 is similar to the semiconductor structure 600 depicted in FIG. 12, but differs from the semiconductor structure 600 depicted in FIG. 12 in that each of the dielectric spacer layers 631' has a multi-layered structure instead of a single-layered structure. With respect to each of the spacer features 635 of the semiconductor structure 600' depicted in FIG. 13, the dielectric spacer layer 631' includes a first dielectric spacer film 6311 and a second dielectric spacer film 6312; the first dielectric spacer film 6311 has a thermal conductivity higher than that of the second dielectric spacer film 6312, and contacts the lateral surfaces of the corresponding conductive features 624; the second dielectric spacer film 6312 conformally covers the first dielectric spacer film 6311; and the sustaining cap 633' is formed on the second dielectric spacer film 6312, and cooperates with the second dielectric spacer film 6312 to define the air gap 693.

A method for manufacturing the semiconductor structure 600' depicted in FIG. 13 is similar to the method 100 shown in FIG. 1, but differs from the method 100 shown in FIG. 1 in the way of forming the dielectric capping layer which is used to form the dielectric spacer layers 631'. With respect to the method for manufacturing the semiconductor structure 600' depicted in FIG. 13, the dielectric capping layer includes a first dielectric capping film for forming the first dielectric spacer films 6311 of the dielectric spacer layers 631' and a second dielectric capping film for forming the second dielectric spacer films 6312 of the dielectric spacer layers 631', and the first dielectric capping film and the second dielectric capping film are sequentially and conformally formed on the semiconductor structure 600 depicted in FIG. 6. In some embodiments, each of the first dielectric capping film and the second dielectric capping film may be formed by a suitable deposition process known to those skilled in the art of semiconductor fabrication, such as physical vapor deposition (PVD), chemical vapor deposition (CVD), atomic layer deposition (ALD), plasma-enhanced chemical vapor deposition (PECVD), plasma-enhanced atomic layer deposition (PEALD), other suitable techniques, or combinations thereof. In some embodiments, the first dielectric capping film may be made of, for example, aluminum nitride, boron nitride (e.g., hexagonal boron nitride (h-BN)), graphene oxide, diamond, silicon carbide, silicon carbonitride, other suitable dielectric materials, or combinations thereof. In some embodiments, the first dielectric capping film may have a thickness that falls within a range of from 2 Å to 50 Å. In some embodiments, the second dielectric capping film may be made of, for example, silicon oxide, silicon oxycarbide, silicon oxynitride, silicon carbonitride, silicon oxycarbonitride, aluminum nitride, aluminum oxynitride, aluminum oxide, other suitable materials, or combinations thereof. In some embodiments, the second dielectric capping film may have a thickness that falls within a range of from about 2 Å to about 50 Å. Thereafter, an excess of the first dielectric capping film is removed so as to form the first dielectric spacer films 6311, and an excess of the second dielectric capping film is removed so as to form the second dielectric spacer films 6312.

Figure 14:
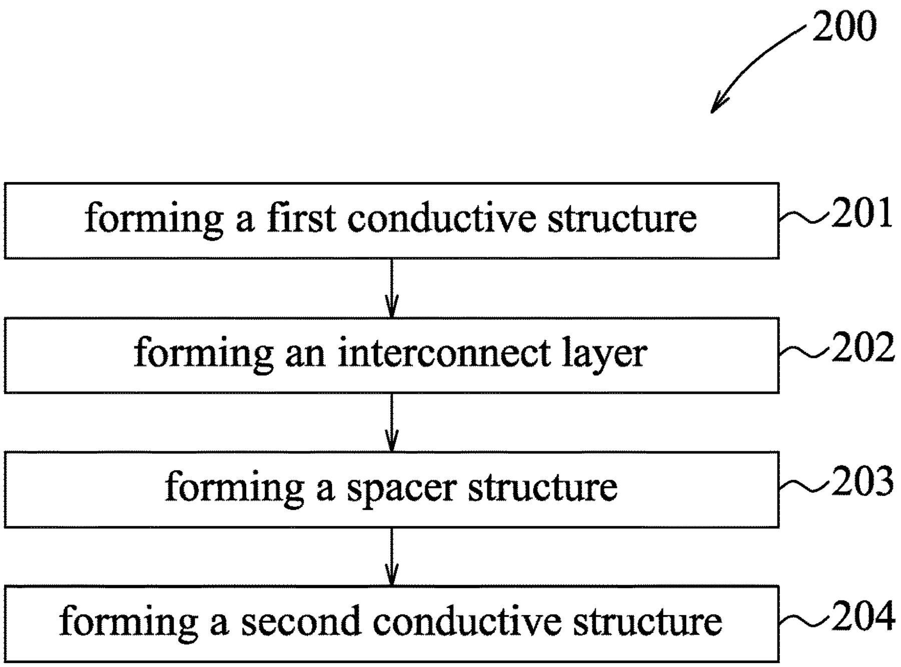
FIG. 14 is a flow chart illustrating a method for manufacturing a semiconductor device in accordance with some embodiments.

FIG. 14 is a flow chart illustrating a method 200 for manufacturing a semiconductor device in accordance with some embodiments. FIGS. 15 to 24 are schematic sectional views of semiconductor structures 700 during various stages of the method 200. The method 200 and the semiconductor structures 700 will be described together below. It should be noted that additional steps can be provided before, after or during the method 200, and some of the steps described herein may be replaced by other steps or be eliminated. Similarly, further additional features may be present in the semiconductor structures 700, and/or features present may be replaced or eliminated in additional embodiments.

Figure 15:
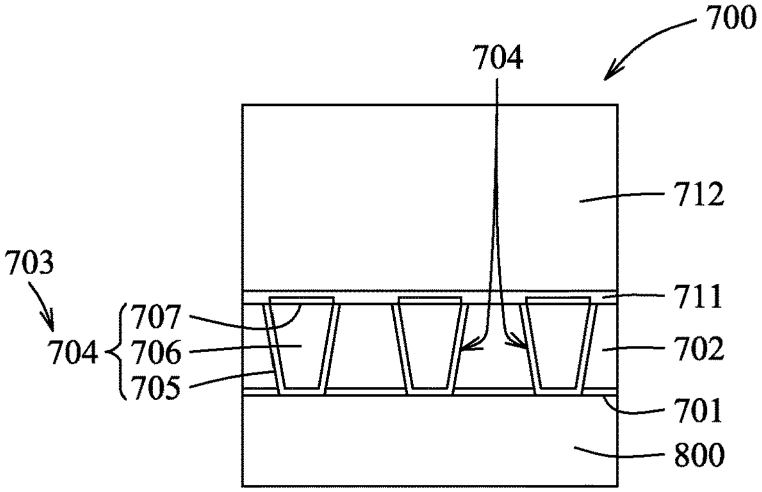
FIGS. 15 to 24 are schematic sectional views illustrating intermediate stages of the method for manufacturing a semiconductor device in accordance with some embodiments.

Referring to FIGS. 14 and 15, the method 200 begins at step 201, where a first conductive structure 703 is formed on a substrate 800. The first conductive structure 703 includes multiple conductive features 704 that are spaced apart from each other. Each of the conductive features 704 includes a barrier film 705, a conductive element 706 and a conductive capping film 707, where the barrier film 705 covers side and bottoms surfaces of the conductive element 706, and the conductive capping film 707 covers a top surface of the conductive element 706. The substrate 800 is similar to the substrate 900 shown in FIG. 2. In some embodiments, step 201 may be implemented as described below.

First, an etch stop layer 701 and a dielectric layer 702 that cooperatively define multiple through holes are formed on the substrate 800 by a suitable deposition process known to those skilled in the art of semiconductor fabrication, such as CVD, PECVD, ALD, PEALD, other suitable techniques, or combinations thereof. Next, a barrier material and a conductive material are filled into the through holes by a suitable deposition process known to those skilled in the art of semiconductor fabrication, such as CVD, PECVD, ALD, PEALD, other suitable techniques, or combinations thereof, and are then subjected to a planarization treatment (e.g., CMP), so as to form the barrier films 705 and the conductive elements 706 of the conductive features 704 in the through holes. Lastly, the conductive capping films 707 of the conductive features 704 are selectively formed on the conductive elements 706. In some embodiments, the etch stop layer 701 may have a single-layered structure or a multi-layered structure, and may be made of aluminum compounds (e.g., aluminum nitride, aluminum oxynitride, aluminum oxide, etc.), silicon compounds (e.g., silicon oxycarbide, silicon carbonitride, silicon nitride, silicon oxycarbonitride, etc.), other suitable materials, or combinations thereof. In some embodiments, the dielectric layer 702 may be made of a low-k dielectric material, such as silicon oxide, silicon nitride, silicon carbide, silicon oxycarbide, silicon oxynitride, silicon carbonitride, silicon oxycarbonitride, other suitable materials, or combinations thereof. In some embodiments, the barrier material for forming the barrier films 705 may be made of, for example, Ru, Mn, Co, Cr, titanium nitride, titanium tungsten, Ta, tantalum nitride, tungsten nitride, other suitable materials, or combinations thereof. In some embodiments, the conductive material for forming the conductive elements 706 may be, for example, Cu, Co, Ru, Mo, Cr, W, Mn, Rh, Ir, Ni, Pd, Pt, Ag, Au, Al, or alloys thereof. In some embodiments, the conductive capping films 707 may be made of, for example, Cu, Co, Ru, Mo, Cr, W, Mn, Rh, Ir, Ni, Pd, Pt, Ag, Au, Al, or alloys thereof.

Figure 16:
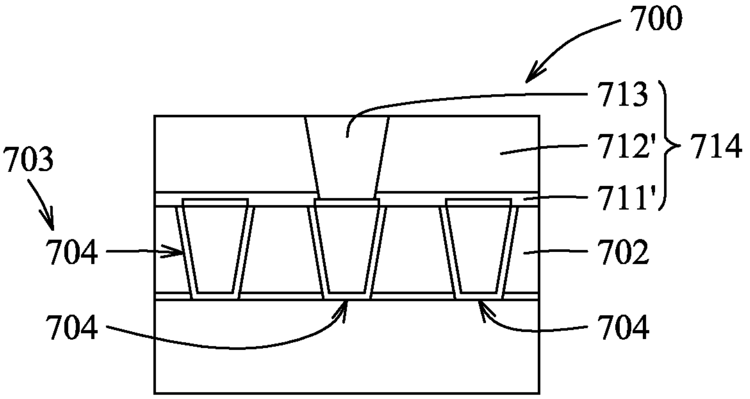

Referring to FIGS. 14, 15 and 16, the method 200 then proceeds to step 202, where an interconnect layer 714 is formed on the first conductive structure 703 and the dielectric layer 702. As shown in FIG. 16, the interconnect layer 714 includes a patterned etch stop layer 711', a patterned dielectric layer 712' and a conductive interconnect 713. The patterned etch stop layer 711' is disposed on the first conductive structure 703 and the dielectric layer 702. The patterned dielectric layer 712' is disposed on the patterned etch stop layer 711'. The patterned etch stop layer 711' and the patterned dielectric layer 712' cooperatively define a through hole that exposes one of the conductive features 704. The conductive interconnect 713 (e.g., a conductive via) is filled in the through hole, and is electrically connected to said one of the conductive features 704. In some embodiments, step 203 may be implemented as described below.

First, as shown in FIG. 15, an etch stop layer 711 and a dielectric layer 712 are sequentially formed on the first conductive structure 703 and the dielectric layer 702. In some embodiments, the etch stop layer 711 may be formed on the first conductive structure 703 and the dielectric layer 702 by a suitable deposition process known to those skilled in the art of semiconductor fabrication, such as CVD, PECVD, ALD, PEALD, other suitable techniques, or combinations thereof. In some embodiments, the etch stop layer 711 may have a single-layered structure or a multi-layered structure, and may be made of aluminum compounds (e.g., aluminum nitride, aluminum oxynitride, aluminum oxide, etc.), silicon compounds (e.g., silicon oxycarbide, silicon carbonitride, silicon nitride, silicon oxycarbonitride, etc.), other suitable materials, or combinations thereof. In some embodiments, the dielectric layer 712 may be formed on the etch stop layer 711 by a suitable deposition process known to those skilled in the art of semiconductor fabrication, such as CVD, PECVD, ALD, PEALD, other suitable techniques, or combinations thereof. In some embodiments, the dielectric layer 712 may be made of a low-k dielectric material, such as silicon oxide, silicon nitride, silicon carbide, silicon oxycarbide, silicon oxynitride, silicon carbonitride, silicon oxycarbonitride, other suitable materials, or combinations thereof.

Next, as shown in FIGS. 15 and 16, the dielectric layer 712 and the etch stop layer 711 are patterned to form the patterned dielectric layer 712' and the patterned etch stop layer 711'. In some embodiments, the dielectric layer 712 and the etch stop layer 711 may be patterned using a photolithography process and an etching process known to those skilled in the art of semiconductor fabrication. The photolithography process may include, for example, but not limited to, coating the dielectric layer 712 with a photoresist, soft-baking, exposing the photoresist through a photomask, post-exposure baking, developing the photoresist, and hard-baking, so as to form a patterned photoresist. The etching process may be implemented by etching the dielectric layer 712 and the etch stop layer 711 through the patterned photoresist using, for example, dry etching, wet etching, RIE, atomic layer etching (ALE), other suitable techniques, or combinations thereof.

Lastly, as shown in FIG. 16, the conductive interconnect 713 is formed in the through hole by: (a) depositing a conductive material for forming the conductive interconnect 713 on the patterned photoresist, the patterned dielectric layer 712', the patterned etch stop layer 711' and the conductive feature 704 exposed from the through hole to fill the through hole using, for example, CVD, PECVD, ALD, PEALD, electroplating, electroless plating, other suitable techniques, or combinations thereof; and (b) removing an excess of the conductive material, the patterned photoresist and an excess of the patterned dielectric layer 712' using, for example, CMP, or other suitable planarization techniques. A portion of the conductive material that remains in the through hole serves as the conductive interconnect 713. In some embodiments, the conductive material may be made of, for example, Ru, Mo, W, or alloys thereof.

Figure 19:
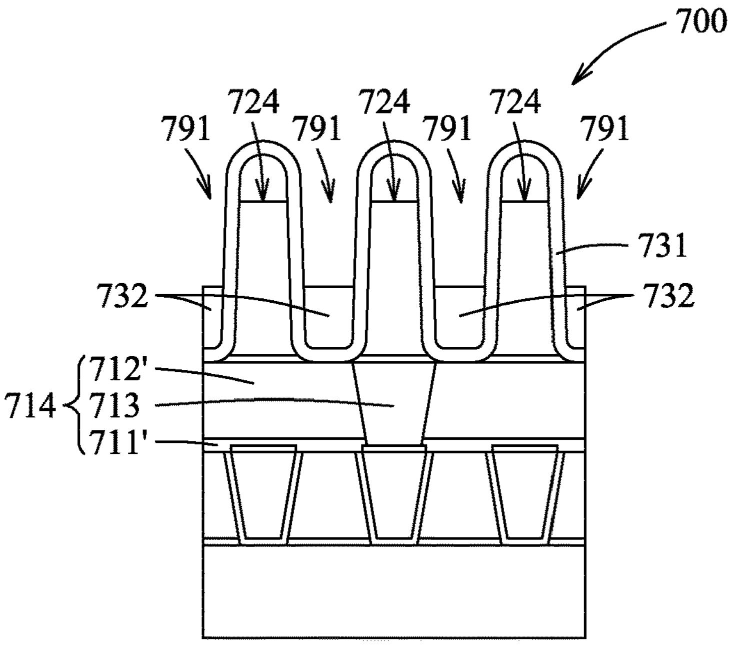
Figure 20:
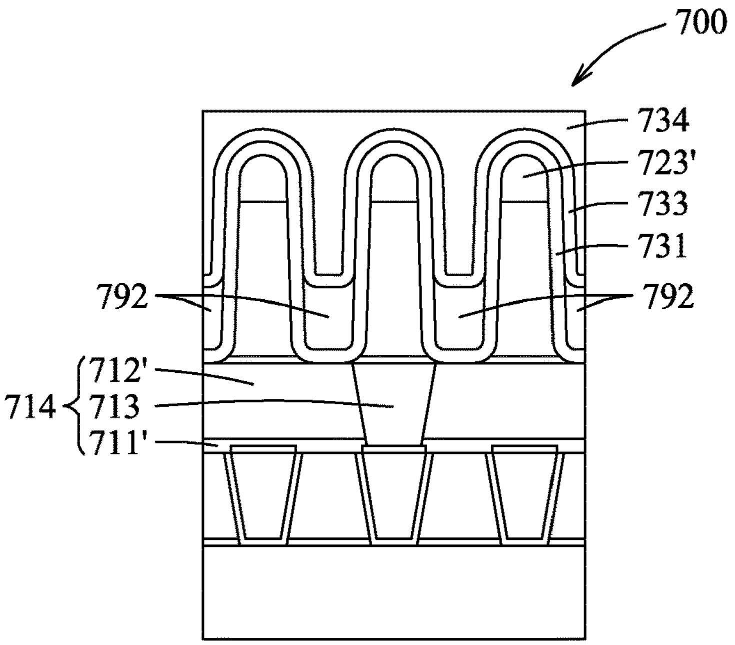
Figure 21:
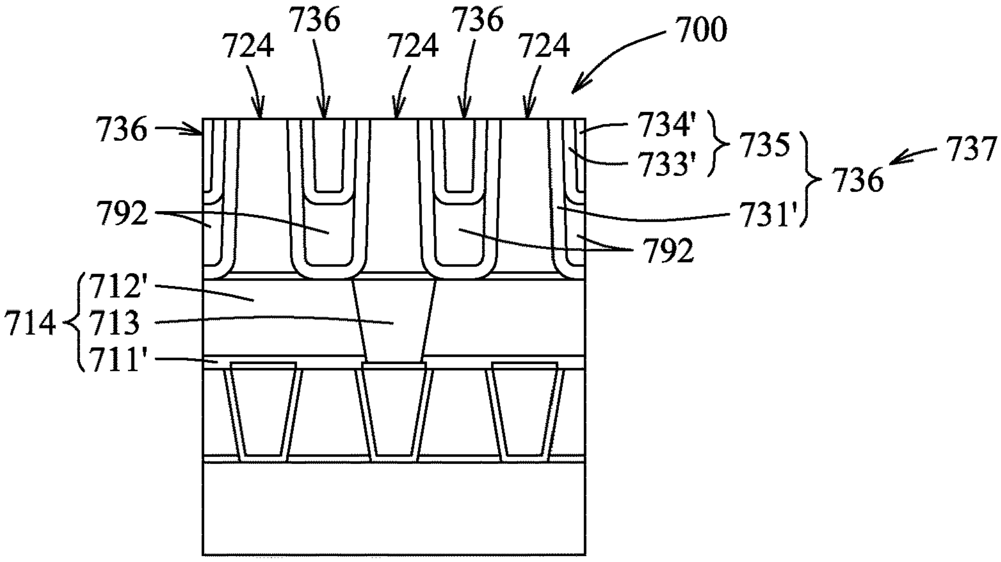

Referring to FIGS. 14 and 17-21, the method 200 then proceeds to step 203, where a spacer structure 737 is formed on the interconnect layer 714. As shown in FIG. 21, the spacer structure 737 includes multiple spacer features 736. Adjacent two of the spacer features 736 are spaced apart from each other. The spacer features 736 are prevented from growing on the conductive interconnect 713. Each of the spacer features 736 includes a dielectric spacer layer 731' and a cover segment 735, where the cover segment 735 includes a sustaining cap 733' and a dielectric spacer element 734'. With respect to each of the spacer features 736, the dielectric spacer layer 731' is formed into a caved shape; the sustaining cap 733' is formed on the dielectric spacer layer 731', contacts the dielectric spacer layer 731', and cooperates with the dielectric spacer layer 731' to define an air gap 792 therebetween; and the dielectric spacer element 734' is formed on the sustaining cap 733', and side and bottom surfaces of the dielectric spacer element 734' are covered by the sustaining cap 733'. In some embodiments, step 203 may be implemented as described below.

Figure 17:
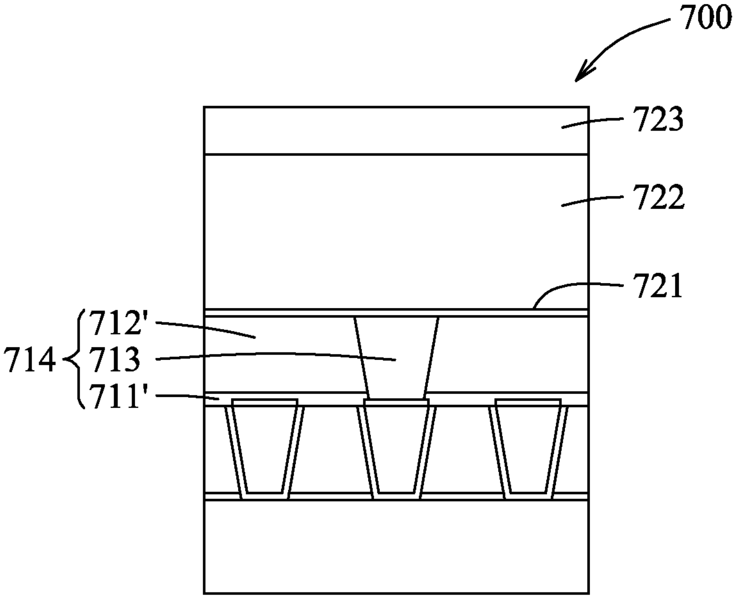

First, as shown in FIG. 17, an etch stop layer 721, a first mask layer 722 (e.g., a hard mask layer) and a second mask layer 723 are sequentially formed on the interconnect layer 714. In some embodiments, each of the etch stop layer 721, the first mask layer 722 and the second mask layer 723 may be formed by a suitable deposition process known to those skilled in the art of semiconductor fabrication, such as CVD, PECVD, ALD, PEALD, other suitable techniques, or combinations thereof. In some embodiments, the etch stop layer 721 may have a single-layered structure or a multi-layered structure, and may be made of aluminum compounds (e.g., aluminum nitride, aluminum oxynitride, aluminum oxide, etc.), silicon compounds (e.g., silicon oxycarbide, silicon carbonitride, silicon nitride, silicon oxycarbonitride, etc.), other suitable materials, or combinations thereof. In some embodiments, each of the first mask layer 722 and the second mask layer 723 may be made of, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, other suitable materials, or combinations thereof.

Figure 18:
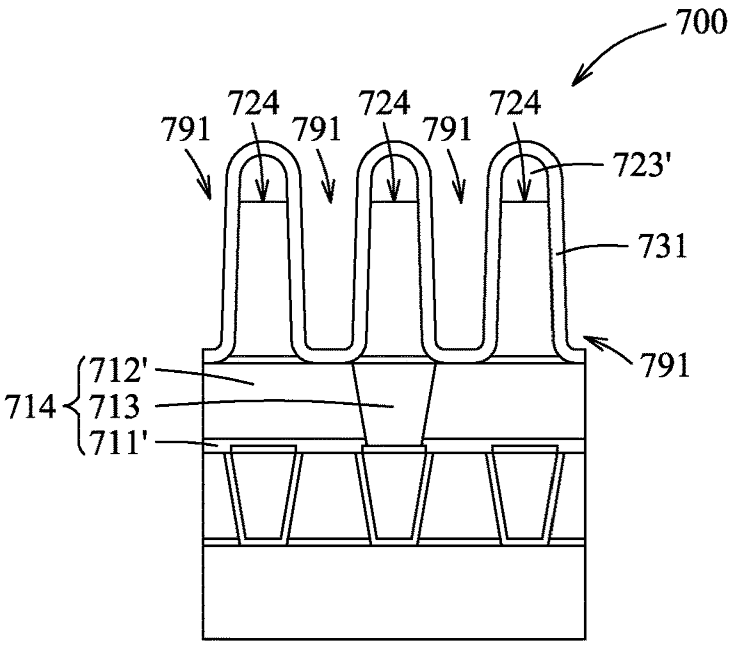

Next, as shown in FIGS. 17 and 18, the second mask layer 723 is patterned using photolithography and photoresist developing technologies as are known to those skilled in the art of semiconductor fabrication. A pattern formed in the patterned second mask layer 723' is then transferred to the first mask layer 722 and the etch stop layer 721 by one or more etching processes to form multiple dummy features 724 and multiple recesses 791. Adjacent two of the dummy features 724 are spaced apart from each other by a corresponding one of the recesses 791. The etching process for forming the dummy features 724 may be implemented by, for example, RIE, plasma etching, deep RIE, atomic layer etching, other suitable techniques, or combinations thereof.

Then, as shown in FIG. 18, a dielectric capping layer 731 for forming the dielectric spacer layers 731' of the spacer features 736 shown in FIG. 21 is conformally formed on the patterned second mask layer 723', the dummy features 724 and the interconnect layer 714. In some embodiments, the dielectric capping layer 731 may be formed by a suitable deposition process known to those skilled in the art of semiconductor fabrication, such as CVD, PECVD, ALD, PEALD, other suitable techniques, or combinations thereof. In some embodiments, the dielectric capping layer 731 may be made of, for example, silicon oxide, silicon oxycarbide, silicon oxynitride, silicon carbonitride, silicon oxycarbonitride, aluminum nitride, aluminum oxynitride, aluminum oxide, other suitable materials, or combinations thereof. In some embodiments, the dielectric capping layer 731 may have a dielectric constant that falls within a range of from about 3 to about 9. In some embodiments, the dielectric capping layer 731 may have a thickness that falls within a range of from about 15 Å to about 100 Å. The performance of the semiconductor structure 700 may degrade when any one of the dielectric constant and the thickness of the dielectric capping layer 731 is outside the corresponding range.

Next, as shown in FIG. 19, a sacrificial layer is formed on the dielectric capping layer 731 to fill the recesses 791, and the sacrificial layer is then planarized and etched back to form multiple sacrificial features 732 in the recesses 791. In some embodiments, the sacrificial layer may be formed by a suitable deposition process known to those skilled in the art of semiconductor fabrication, such as CVD, PECVD, ALD, PEALD, spin-on deposition, other suitable techniques, or combinations thereof. In some embodiments, the sacrificial layer may include a sacrificial polymer; examples of the sacrificial polymer include polylactic acid, polycaprolactone, polyurea, poly(methyl methacrylate), poly(ethylene oxide), other suitable materials, and combinations thereof. In some embodiments, planarizing the sacrificial layer may be conducted by a thermal process, an ultraviolet process, other suitable techniques, or combinations thereof. In some embodiments, etching back the sacrificial layer may be conducted by using etching/ashing plasma (e.g., $O_2$, $N_2$, $H_2$, He, Ar, etc.). Etching back the sacrificial layer can control the heights of the sacrificial features 732.

Then, as shown in FIGS. 19 and 20, a sustaining layer 733 for forming the sustaining caps 733' of the cover segments 735 of the spacer features 736 shown in FIG. 21 is conformally formed on the dielectric capping layer 731 and the sacrificial features 732, then a dielectric cover layer 734 for forming the dielectric spacer elements 734' of the cover segments 735 of the spacer features 736 shown in FIG. 21 is formed on the sustaining layer 733, and finally the sacrificial features 732 are removed so as to form multiple air gaps 792 that are covered by the sustaining layer 733. In some embodiments, the sustaining layer 733 may be formed by a suitable deposition process known to those skilled in the art of semiconductor fabrication, such as CVD, PECVD, ALD, PEALD, spin-on deposition, other suitable techniques, or combinations thereof. In some embodiments, the sustaining layer 733 may be made of, for example, silicon oxide, silicon oxycarbide, silicon oxynitride, silicon carbonitride, silicon oxycarbonitride, other suitable materials, or combinations thereof. In some embodiments, the dielectric cover layer 734 may be formed by a suitable deposition process known to those skilled in the art of semiconductor fabrication, such as CVD, PECVD, ALD, PEALD, other suitable techniques, or combinations thereof. In some embodiments, the dielectric cover layer 734 may be made of a low-k dielectric material such as SiCOH, which is a dielectric material containing silicon (Si), carbon (C), oxygen (O), and hydrogen (H) atoms. In some embodiments, the sacrificial features 732 may be removed by a thermal process, an ultraviolet process, other suitable techniques, or combinations thereof. It should be noted that removing the sacrificial features 732 may be conducted before, instead of after, forming the dielectric cover layer 734.

Lastly, as shown in FIGS. 20 and 21, the semiconductor structure 700 depicted in FIG. 20 is subjected to a planarization treatment (e.g., CMP) to expose the dummy features 724 and form the spacer features 736. An excess of the dielectric cover layer 734 is removed so as to form the dielectric spacer elements 734' of the cover segments 735 of the spacer features 736. An excess of the sustaining layer 733 is removed so as to form the sustaining caps 733' of the cover segments 735 of the spacer features 736. An excess of the dielectric capping layer 731 is removed so as to form the dielectric spacer layers 731' of the spacer features 736. The patterned second mask layer 723' is removed so as to expose the dummy features 724.

Figure 22:
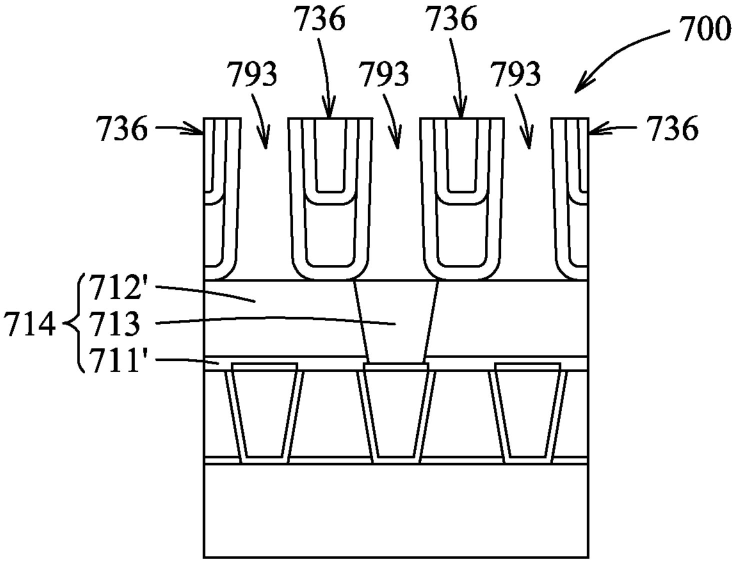
Figure 23:
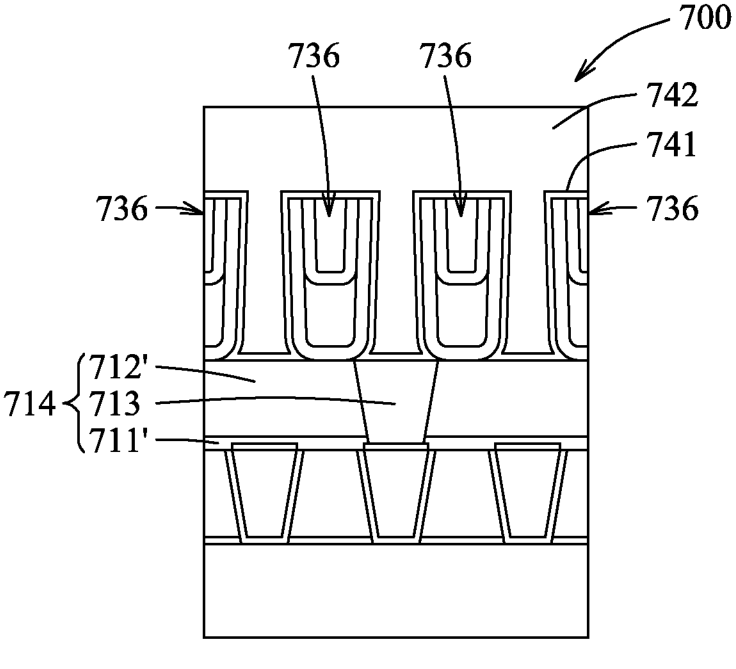
Figure 24:
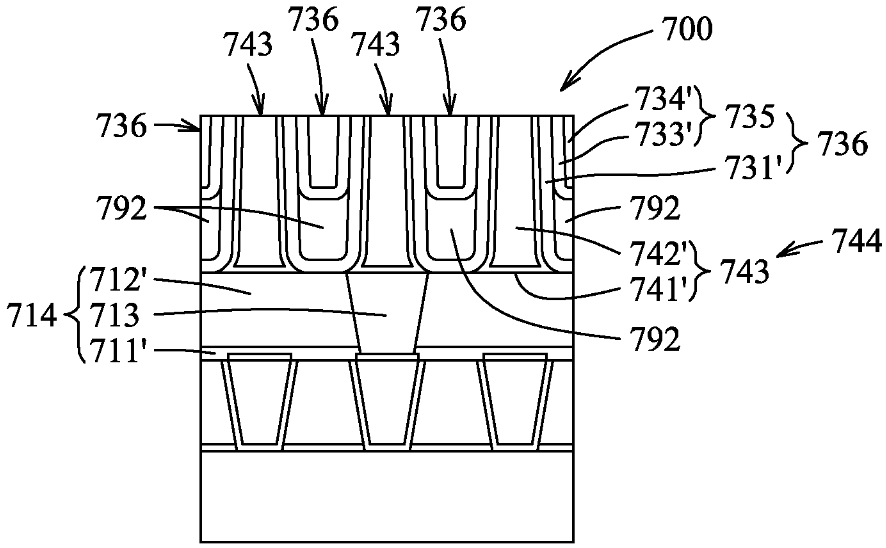

Referring to FIGS. 14 and 21-24, the method 200 then proceeds to step 204, where a second conductive structure 744 is formed on the interconnect layer 714. As shown in FIG. 24, the second conductive structure 744 includes multiple conductive features 743 (e.g., conductive metal lines). Each of the conductive features 743 includes a barrier film 741' and a conductive element 742', where the barrier film 741' covers side and bottom surfaces of the conductive element 742'. Adjacent two of the conductive features 743 are spaced apart from each other by a corresponding one of the spacer features 736. One of the conductive features 743 is electrically connected to the conductive interconnect 713. In some embodiments, step 204 may be implemented as described below.

First, as shown in FIGS. 21 and 22, the dummy features 724 are removed to form multiple recesses 793. One of the recesses 793 exposes the conductive interconnect 713. In some embodiments, the dummy features 724 may be removed by a suitable etching process known to those skilled in the art of semiconductor fabrication, such as dry etching, wet etching, other suitable techniques, or combinations thereof.

Next, as shown in FIGS. 22 and 23, a barrier layer 741 is conformally formed on the spacer features 736 and the interconnect layer 714, and then a conductive layer 742 is formed on the barrier layer 741 to fill the recesses 793. In some embodiments, each of the barrier layer 741 and the conductive layer 742 may be formed by a suitable deposition process known to those skilled in the art of semiconductor fabrication, such as CVD, PECVD, ALD, PEALD, other suitable techniques, or combinations thereof. In some embodiments, the barrier layer 741 may be made of, for example, Ru, Mn, Co, Cr, titanium nitride, titanium tungsten, Ta, tantalum nitride, tungsten nitride, other suitable materials, or combinations thereof. In some embodiments, the conductive layer 742 may be, for example, Cu, Co, Ru, Mo, Cr, W, Mn, Rh, Ir, Ni, Pd, Pt, Ag, Au, Al, or alloys thereof.

Lastly, as shown in FIGS. 23 and 24, the semiconductor structure 700 depicted in FIG. 23 is subjected to a planarization treatment (e.g., CMP) to expose the spacer features 736, and to form the conductive features 743 in the recesses 793 shown in FIG. 22. An excess of the conductive layer 742 is removed so as to form the conductive elements 742' of the conductive features 743. An excess of the barrier layer 741 is removed so as to form the barrier film 741' of the conductive features 743.

In view of the above, since the dielectric cover layer 734 shown in FIG. 20 is not etched, the dielectric capacitance of the semiconductor structure 700 would not be increased. In addition, since the conductive interconnect 713 shown in FIG. 24 is not covered by a barrier layer, the semiconductor structure 700 can have a low contact resistance. Moreover, by virtue of the air gaps 792 shown in FIG. 24, the semiconductor structure 700 can have a low dielectric capacitance.

Figure 25:
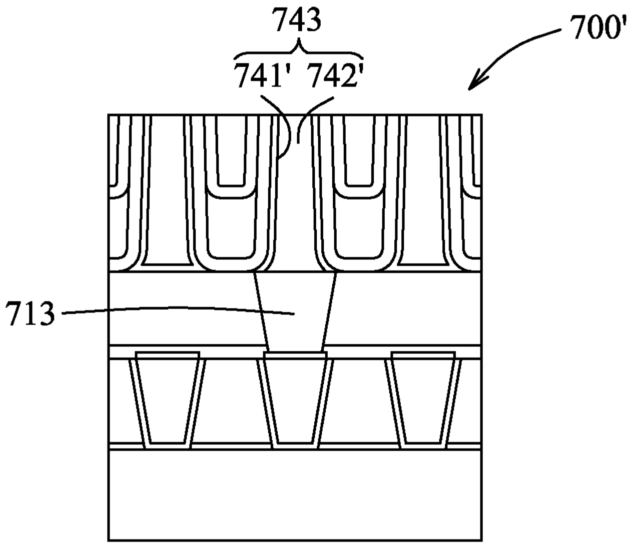
FIG. 25 is a schematic sectional view illustrating a semiconductor device in accordance with some embodiments.

FIG. 25 is a schematic sectional view illustrating a semiconductor structure 700' in accordance with some embodiments. The semiconductor structure 700' depicted in FIG. 25 is similar to the semiconductor structure 700 depicted in FIG. 24, but differs from the semiconductor structure 700 depicted in FIG. 24 in that, with respect to the conductive feature 743 that is electrically connected to the conductive interconnect 713, the barrier film 741' thereof does not cover the top surface of the conductive interconnect 713, so the conductive element 742' thereof contacts the conductive interconnect 713. Therefore, the semiconductor structure 700' depicted in FIG. 25 can have a reduced contact resistance.

A method for manufacturing the semiconductor structure 700' depicted in FIG. 25 is similar to the method 200 shown in FIG. 14, but differs from the method 200 shown in FIG. 14 in that the barrier layer 741 shown in FIG. 23 is prevented from growing on the conductive interconnect 713.

Figure 26:
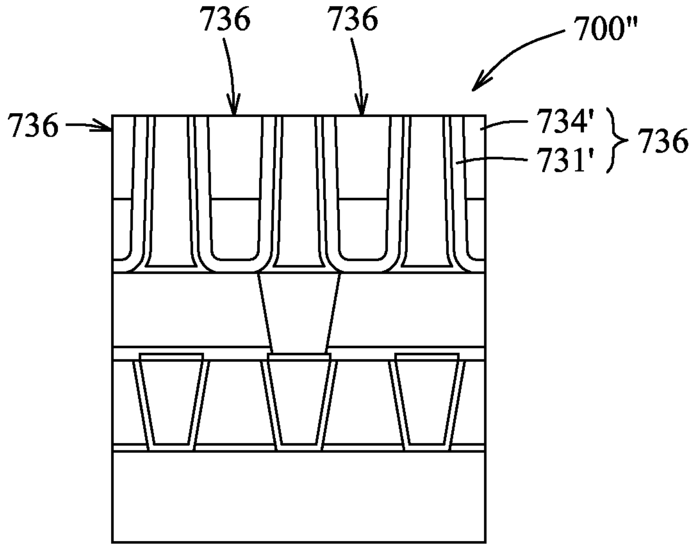
FIG. 26 is a schematic sectional view illustrating a semiconductor device in accordance with some embodiments.

FIG. 26 is a schematic sectional view illustrating a semiconductor structure 700" in accordance with some embodiments. The semiconductor structure 700" depicted in FIG. 26 is similar to the semiconductor structure 700 depicted in FIG. 24, but differs from the semiconductor structure 700 depicted in FIG. 24 in that, with respect to each of the spacer features 736, the sustaining cap 733' of the cover segment 735 shown in FIG. 24 is omitted, so the dielectric spacer element 734' contacts the dielectric spacer layer 731' as shown in FIG. 26.

A method for manufacturing the semiconductor structure 700" depicted in FIG. 26 is similar to the method 200 shown in FIG. 14, but differs from the method 200 shown in FIG. 14 in that the sustaining layer 733 shown in FIG. 20 is not formed.

Figure 27:
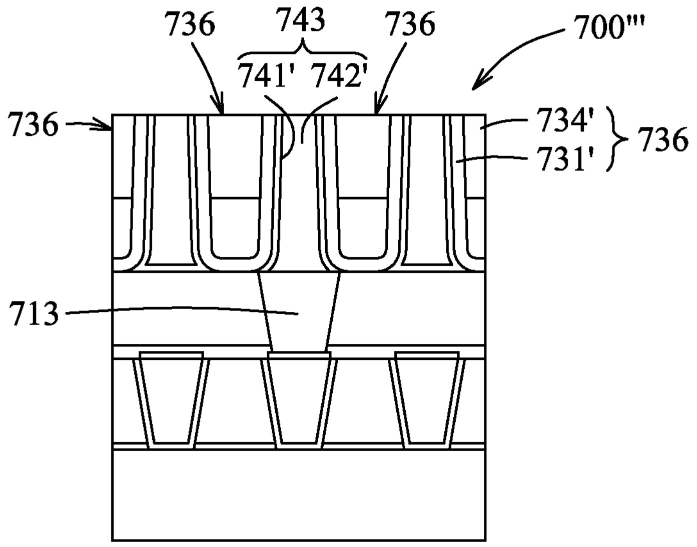
FIG. 27 is a schematic sectional view illustrating a semiconductor device in accordance with some embodiments.

FIG. 27 is a schematic sectional view illustrating a semiconductor structure 700'" in accordance with some embodiments. The semiconductor structure 700'" depicted in FIG. 27 is similar to the semiconductor structure 700 depicted in FIG. 24, but differs from the semiconductor structure 700 depicted in FIG. 24 in that: (a) with respect to the conductive feature 743 that is electrically connected to the conductive interconnect 713, the barrier film 741' thereof does not cover the top surface of the conductive interconnect 713, so the conductive element 742' thereof contacts the conductive interconnect 713; and (b) with respect to each of the spacer features 736, the sustaining cap 733' of the cover segment 735 shown in FIG. 24 is omitted, so the dielectric spacer element 734' contacts the dielectric spacer layer 731' as shown in FIG. 27.

A method for manufacturing the semiconductor structure 700'" depicted in FIG. 27 is similar to the method 200 shown in FIG. 14, but differs from the method 200 shown in FIG. 14 in that the barrier layer 741 shown in FIG. 23 does not cover the conductive interconnect 713 and that the sustaining layer 733 shown in FIG. 20 is not formed.

In accordance with some embodiments of the present disclosure, a method for manufacturing a semiconductor device includes: forming a conductive structure; forming an interconnect layer on the conductive structure, the interconnect layer including a conductive interconnect that is electrically connected to the conductive structure; and forming a plurality of conductive features and a plurality of spacer features on the interconnect layer, adjacent two of the conductive features being spaced apart from each other by a corresponding one of the spacer features, one of the conductive features being electrically connected to the conductive interconnect, each of the spacer features including a dielectric spacer layer contacting lateral surfaces of two of the conductive features that are adjacent to the spacer feature, and a cover segment disposed on the dielectric spacer layer and cooperating with the dielectric spacer layer to define an air gap between said two of the conductive features that are adjacent to the spacer feature.

In accordance with some embodiments of the present disclosure, the spacer features are formed after the conductive features are formed, and are formed by: conformally forming a dielectric capping layer on the conductive features and the interconnect layer; filling a sacrificial material into a plurality of recesses that separate the conductive features; recessing the sacrificial material to form sacrificial features in the recesses; conformally forming a sustaining layer on the dielectric capper layer and the sacrificial features; and removing the sacrificial features to form the air gaps of the spacer features.

In accordance with some embodiments of the present disclosure, with respect to each of the spacer features, the dielectric spacer layer includes a first dielectric spacer film and a second dielectric spacer film, the first dielectric spacer film has a thermal conductivity higher than a thermal conductivity of the second dielectric spacer film, and is formed into a caved shape, the first dielectric spacer film contacts the lateral surfaces of said two of the conductive features that are adjacent to the spacer feature, the second dielectric spacer film conformally covers the first dielectric spacer film, and the cover segment is formed on the second dielectric spacer film, and cooperates with the second dielectric spacer film to define the air gap.

In accordance with some embodiments of the present disclosure, the spacer features are formed before the conductive features are formed, and are formed by: forming a plurality of dummy features on the interconnect layer, adjacent two of the dummy features being spaced apart from each other by a corresponding one of a plurality of first recesses; conformally forming a dielectric capping layer on the dummy features and the interconnect layer; filling a sacrificial material into the first recesses; recessing the sacrificial material to form sacrificial features in the first recesses; conformally forming a sustaining layer on the dielectric capper layer and the sacrificial features; and removing the sacrificial features to form the air gaps of the spacer features.

In accordance with some embodiments of the present disclosure, the conductive features are formed by: removing the dummy features to form a plurality of second recesses; conformally forming a barrier layer on the spacer features and the interconnect layer; forming a conductive layer on the barrier layer to fill the second recesses; and removing a portion of the conductive layer and a portion of the barrier layer to expose the spacer features.

In accordance with some embodiments of the present disclosure, the conductive features are formed by: removing the dummy features to form a plurality of second recesses; conformally forming a barrier layer on the spacer features and the interconnect layer, the barrier layer exposing the conductive interconnect; forming a conductive layer on the barrier layer and the interconnect layer to fill the second recesses; and removing a portion of the conductive layer and a portion of the barrier layer to expose the spacer features.

In accordance with some embodiments of the present disclosure, the spacer features are formed before the conductive features are formed, and are formed by: forming a plurality of dummy features on and a plurality of recesses in the interconnect layer, adjacent two of the dummy features being spaced apart from each other by a corresponding one of the recesses; conformally forming a dielectric capping layer on the dummy features and the interconnect layer; filling a sacrificial material into the recesses; recessing the sacrificial material to form sacrificial features in the recesses; forming a dielectric cover layer on the dielectric capper layer and the sacrificial features; and removing the sacrificial features to form the air gaps of the spacer features.

In accordance with some embodiments of the present disclosure, a method for manufacturing a semiconductor device includes: forming an interconnect layer that includes a conductive interconnect; forming a plurality of spacer features on and a plurality of first recesses in the interconnect layer, adjacent two of the spacer features being spaced apart from each other by a corresponding one of the first recesses, one of the first recesses exposing the conductive interconnect, each of the spacer features including a dielectric spacer layer having a caved shape, and a cover segment disposed on the dielectric spacer layer and cooperating with the dielectric spacer layer to define an air gap therebetween; and forming a plurality of conductive features in the first recesses.

In accordance with some embodiments of the present disclosure, the spacer features are formed by: forming a plurality of dummy features on and a plurality of second recesses in the interconnect layer, adjacent two of the dummy features being spaced apart from each other by a corresponding one of the second recesses; conformally forming a dielectric capping layer on the dummy features and the interconnect layer; filling a sacrificial material into the second recesses; recessing the sacrificial material to form sacrificial features in the first recesses; forming a dielectric cover layer on the dielectric capper layer and the sacrificial features; and removing the sacrificial features to form the air gaps of the spacer features.

In accordance with some embodiments of the present disclosure, the conductive features are formed by: removing the dummy features to form the first recesses; conformally forming a barrier layer on the spacer features and the interconnect layer; forming a conductive layer on the barrier layer to fill the first recesses; and removing a portion of the conductive layer and a portion of the barrier layer to expose the spacer features.

In accordance with some embodiments of the present disclosure, the conductive features are formed by: removing the dummy features to form the first recesses; conformally forming a barrier layer on the spacer features and the interconnect layer, the barrier layer exposing the conductive interconnect; forming a conductive layer on the barrier layer and the interconnect layer to fill the first recesses; and removing a portion of the conductive layer and a portion of the barrier layer to expose the spacer features.

In accordance with some embodiments of the present disclosure, a semiconductor device includes a conductive structure, an interconnect layer, a first conductive feature, a second conductive feature and a spacer feature. The interconnect layer is disposed on the conductive structure, and includes a conductive interconnect that is electrically connected to the conductive structure. The first conductive feature and the second conductive feature are disposed on the interconnect layer. One of the first conductive feature and the second conductive feature is electrically connected to the conductive interconnect. The spacer feature is disposed on the interconnect layer, is configured to separate the first conductive feature and the second conductive feature from each other, and includes a dielectric spacer layer and a cover segment. The dielectric spacer layer contacts lateral surfaces of the first conductive feature and the second conductive feature. The cover segment is formed on the dielectric spacer layer, and cooperates with the dielectric spacer layer to define an air gap between the first conductive feature and the second conductive feature.

In accordance with some embodiments of the present disclosure, the semiconductor device further includes another interconnect layer that is disposed below the conductive structure, and that includes a conductive interconnect electrically connected to the conductive structure.

In accordance with some embodiments of the present disclosure, the conductive interconnect of the another interconnect layer is a conductive contact.

In accordance with some embodiments of the present disclosure, the dielectric spacer layer includes a first dielectric spacer film and a second dielectric spacer film, the first dielectric spacer film has a thermal conductivity higher than a thermal conductivity of the second dielectric spacer film, and contacts the lateral surfaces of the first conductive feature and the second conductive feature, the second dielectric spacer film conformally covers the first dielectric spacer film, and the cover segment is formed on the second dielectric spacer film, and cooperates with the second dielectric spacer film to define the air gap.

In accordance with some embodiments of the present disclosure, the first dielectric spacer film is made of aluminum nitride, boron nitride, graphene oxide, diamond, silicon carbide, silicon carbonitride, or combinations thereof.

In accordance with some embodiments of the present disclosure, the second dielectric spacer film is made of silicon oxide, silicon oxycarbide, silicon oxynride, silicon carbonitride, silicon oxycarbonitride, aluminum nitride, aluminum oxynitride, aluminum oxide, or combinations thereof.

In accordance with some embodiments of the present disclosure, the cover segment includes a dielectric spacer element that contacts the dielectric spacer layer.

In accordance with some embodiments of the present disclosure, the cover segment includes a dielectric spacer element, and a sustaining cap that covers side and bottom surfaces of the dielectric spacer element and that contacts the dielectric spacer layer.

In accordance with some embodiments of the present disclosure, each of the first conductive feature and the second conductive feature includes a conductive element, and a barrier film that at least covers side surfaces of the conductive element.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a conductive structure on a first interconnect layer that includes a first conductive interconnect, the conductive structure being electrically connected to the first conductive interconnect;

forming a second interconnect layer on the conductive structure, the second interconnect layer including a second conductive interconnect that is electrically connected to the conductive structure; and forming a plurality of conductive features and a plurality of spacer features on the second interconnect layer, adjacent two of the conductive features being spaced apart from each other by a corresponding one of the spacer features, one of the conductive features being electrically connected to the second conductive interconnect, each of the spacer features including a dielectric spacer layer contacting lateral surfaces of two of the conductive features that are adjacent to the spacer feature, and a cover segment disposed on the dielectric spacer layer, and cooperating with the dielectric spacer layer to define an air gap between said two of the conductive features that are adjacent to the spacer feature.

2. The method according to claim 1, wherein the spacer features are formed after the conductive features are formed, and are formed by:

conformally forming a dielectric capping layer on the conductive features and the second interconnect layer;

filling a sacrificial material into a plurality of recesses that separate the conductive features;

recessing the sacrificial material to form sacrificial features in the recesses;

conformally forming a sustaining layer on the dielectric capper layer and the sacrificial features; and removing the sacrificial features to form the air gaps of the spacer features.

3. The method according to claim 1, wherein, with respect to each of the spacer features:

the dielectric spacer layer includes a first dielectric spacer film and a second dielectric spacer film;

the first dielectric spacer film has a thermal conductivity higher than a thermal conductivity of the second dielectric spacer film, and is formed into a caved shape;

the first dielectric spacer film contacts the lateral surfaces of said two of the conductive features that are adjacent to the spacer feature;

the second dielectric spacer film conformally covers the first dielectric spacer film; and the cover segment is formed on the second dielectric spacer film, and cooperates with the second dielectric spacer film to define the air gap.

4. The method according to claim 1, wherein the spacer features are formed before the conductive features are formed, and are formed by:

forming a plurality of dummy features on the second interconnect layer, adjacent two of the dummy features being spaced apart from each other by a corresponding one of a plurality of first recesses;

conformally forming a dielectric capping layer on the dummy features and the second interconnect layer;

filling a sacrificial material into the first recesses;

recessing the sacrificial material to form sacrificial features in the first recesses;

conformally forming a sustaining layer on the dielectric capper layer and the sacrificial features; and removing the sacrificial features to form the air gaps of the spacer features.

5. The method according to claim 4, wherein the conductive features are formed by:

removing the dummy features to form a plurality of second recesses;

conformally forming a barrier layer on the spacer features and the second interconnect layer;

forming a conductive layer on the barrier layer to fill the second recesses; and removing a portion of the conductive layer and a portion of the barrier layer to expose the spacer features.

6. The method according to claim 4, wherein the conductive features are formed by:

removing the dummy features to form a plurality of second recesses;

conformally forming a barrier layer on the spacer features and the second interconnect layer, the barrier layer exposing the second conductive interconnect;

forming a conductive layer on the barrier layer and the second interconnect layer to fill the second recesses; and removing a portion of the conductive layer and a portion of the barrier layer to expose the spacer features.

7. The method according to claim 1, wherein the spacer features are formed before the conductive features are formed, and are formed by:

forming a plurality of dummy features and a plurality of recesses on the second interconnect layer, adjacent two of the dummy features being spaced apart from each other by a corresponding one of the recesses;

conformally forming a dielectric capping layer on the dummy features and the second interconnect layer;

filling a sacrificial material into the recesses;

recessing the sacrificial material to form sacrificial features in the recesses;

forming a dielectric cover layer on the dielectric capper layer and the sacrificial features; and removing the sacrificial features to form the air gaps of the spacer features.

8. A method for manufacturing a semiconductor device, comprising:

forming an interconnect layer that includes a conductive interconnect;

forming a plurality of spacer features and a plurality of first recesses on the interconnect layer, adjacent two of the spacer features being spaced apart from each other by a corresponding one of the first recesses, one of the first recesses exposing the conductive interconnect, each of the spacer features including a dielectric spacer layer having a caved shape, and a cover segment disposed on the dielectric spacer layer, and cooperating with the dielectric spacer layer to define an air gap therebetween; and forming a plurality of conductive features in the first recesses;

wherein, with respect to each of the spacer features, the cover segment includes a dielectric spacer element, and a sustaining cap that covers side and bottom surfaces of the dielectric spacer element and that contacts the dielectric spacer layer.

9. The method according to claim 8, wherein the spacer features are formed by:

forming a plurality of dummy features and a plurality of second recesses on the interconnect layer, adjacent two of the dummy features being spaced apart from each other by a corresponding one of the second recesses;

conformally forming a dielectric capping layer on the dummy features and the interconnect layer;

filling a sacrificial material into the second recesses;

recessing the sacrificial material to form sacrificial features in the second recesses;

forming a dielectric cover layer on the dielectric capper layer and the sacrificial features; and removing the sacrificial features to form the air gaps of the spacer features.

10. The method according to claim 9, wherein the conductive features are formed by:

removing the dummy features to form the first recesses;

conformally forming a barrier layer on the spacer features and the interconnect layer;

forming a conductive layer on the barrier layer to fill the first recesses; and removing a portion of the conductive layer and a portion of the barrier layer to expose the spacer features.

11. The method according to claim 9, wherein the conductive features are formed by:

removing the dummy features to form the first recesses;

conformally forming a barrier layer on the spacer features and the interconnect layer, the barrier layer exposing the conductive interconnect;

forming a conductive layer on the barrier layer and the interconnect layer to fill the first recesses; and removing a portion of the conductive layer and a portion of the barrier layer to expose the spacer features.

12. A semiconductor device comprising:

a conductive structure;

an interconnect layer disposed on the conductive structure, and including a conductive interconnect that is electrically connected to the conductive structure;

a first conductive feature and a second conductive feature, which are disposed on the interconnect layer, and one of which is electrically connected to the conductive interconnect; and a spacer feature disposed on the interconnect layer, configured to separate the first conductive feature and the second conductive feature from each other, and including a dielectric spacer layer contacting lateral surfaces of the first conductive feature and the second conductive feature, and a cover segment formed on the dielectric spacer layer, and cooperating with the dielectric spacer layer to define an air gap between the first conductive feature and the second conductive feature;

wherein each of the first conductive feature and the second conductive feature includes a conductive element, and a barrier film that at least covers side surfaces of the conductive element.

13. The semiconductor device according to claim 12, further comprising:

another interconnect layer disposed below the conductive structure, and including a conductive interconnect that is electrically connected to the conductive structure.

14. The semiconductor device according to claim 13, wherein the conductive interconnect of the another interconnect layer is a conductive contact.

15. The semiconductor device according to claim 12, wherein:

the dielectric spacer layer includes a first dielectric spacer film and a second dielectric spacer film;

the first dielectric spacer film has a thermal conductivity higher than a thermal conductivity of the second dielectric spacer film, and contacts the lateral surfaces of the first conductive feature and the second conductive feature;

the second dielectric spacer film conformally covers the first dielectric spacer film; and the cover segment is formed on the second dielectric spacer film, and cooperates with the second dielectric spacer film to define the air gap.

16. The semiconductor device according to claim 15, wherein the first dielectric spacer film is made of aluminum nitride, boron nitride, graphene oxide, diamond, silicon carbide, silicon carbonitride, or combinations thereof.

17. The semiconductor device according to claim 15, wherein the second dielectric spacer film is made of silicon oxide, silicon oxycarbide, silicon oxynride, silicon carbonitride, silicon oxycarbonitride, aluminum nitride, aluminum oxynitride, aluminum oxide, or combinations thereof.

18. The semiconductor device according to claim 12, wherein the cover segment includes a dielectric spacer element that contacts the dielectric spacer layer.

19. The semiconductor device according to claim 12, wherein the cover segment includes a dielectric spacer element, and a sustaining cap that covers side and bottom surfaces of the dielectric spacer element and that contacts the dielectric spacer layer.

20. The semiconductor device according to claim 12, wherein, with respect to each of the first conductive feature and the second conductive feature, the barrier film further covers a bottom surface of the conductive element.

* * * * *